(12) United States Patent
Jankowski

(10) Patent No.: US 11,614,471 B2
(45) Date of Patent: Mar. 28, 2023

(54) CURRENT MEASURING DEVICE FOR DETECTING A CURRENT IN AN ELECTRIC LINE

(71) Applicant: Phoenix Contact GmbH & Co. KG, Blomberg (DE)

(72) Inventor: Martin Jankowski, Seelze (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 49 days.

(21) Appl. No.: 17/267,854

(22) PCT Filed: Aug. 7, 2019

(86) PCT No.: PCT/EP2019/071244
§ 371 (c)(1),
(2) Date: Feb. 11, 2021

(87) PCT Pub. No.: WO2020/035372
PCT Pub. Date: Feb. 20, 2020

(65) Prior Publication Data
US 2021/0172980 A1 Jun. 10, 2021

(30) Foreign Application Priority Data
Aug. 16, 2018 (DE) .................... 10 2018 120 009.9

(51) Int. Cl.
*G01R 15/20* (2006.01)
*G01R 19/00* (2006.01)

(52) U.S. Cl.
CPC ......... *G01R 15/205* (2013.01); *G01R 15/207* (2013.01); *G01R 19/0092* (2013.01)

(58) Field of Classification Search
CPC ........................... G01R 15/205; G01R 15/207; G01R 19/0092; Y02E 10/50
See application file for complete search history.

(56) References Cited

U.S. PATENT DOCUMENTS

| 3,199,026 A | 8/1965 | Leibowitz |
| 4,914,383 A | 4/1990 | Wilkerson |

(Continued)

FOREIGN PATENT DOCUMENTS

| DE | 69805586 T2 | 10/2002 |
| DE | 102014119276 A1 | 6/2016 |

(Continued)

OTHER PUBLICATIONS

Fluke, "Hand-multimeter, current pliers digital Fluke T6-600/EU Calibrated according to: factory standard", Mar. 16, 2018, model No. T6-600/EU, Conrad Electronic SE, Hirschau, Germany.

(Continued)

*Primary Examiner* — Dominic E Hawkins
(74) *Attorney, Agent, or Firm* — Leydig, Voit & Mayer, Ltd.

(57) ABSTRACT

A current measuring device for detecting a current in an electric line includes: a housing; a fastening device arranged on the housing for fastening the housing to a supporting rail; and at least one magnetic field sensor. The housing has a first housing part and a second housing part which together form an accommodating device for accommodating an electric line between the first and second housing parts. The first and second housing parts are separable from one another in order to place an electric line onto the current measuring device and placeable onto one another in order to accommodate the electric line in the accommodating device between the first and second housing parts. The at least one magnetic field sensor detects a magnetic field on the electric line accommodated in the accommodating device.

12 Claims, 5 Drawing Sheets

(56) References Cited

U.S. PATENT DOCUMENTS

| | | | |
|---|---|---|---|
| 6,043,640 A | 3/2000 | Aikins et al. | |
| 6,329,810 B1 * | 12/2001 | Reid | G01R 22/065 |
| | | | 324/142 |
| 9,465,054 B2 * | 10/2016 | Sakamoto | G01R 15/207 |
| 9,810,717 B2 * | 11/2017 | Tian | G01R 15/18 |
| 2005/0178573 A1 | 8/2005 | James | |
| 2011/0057650 A1 | 3/2011 | Hellwig et al. | |
| 2012/0306486 A1 | 12/2012 | Krummenacher et al. | |
| 2013/0141077 A1 | 6/2013 | Keselman et al. | |
| 2014/0210453 A1 | 7/2014 | El-Essawy et al. | |
| 2015/0212117 A1 * | 7/2015 | Hackner | G01R 15/207 |
| | | | 324/117 H |
| 2018/0031613 A1 | 2/2018 | Nakayama | |
| 2018/0203044 A1 | 7/2018 | Magno | |

FOREIGN PATENT DOCUMENTS

| | | |
|---|---|---|
| DE | 102015115410 A1 | 3/2017 |
| DE | 102016123255 A1 | 6/2018 |
| EP | 3086129 A1 | 10/2016 |
| GB | 2522058 A | 7/2015 |

OTHER PUBLICATIONS

U.S. Appl. No. 17/266,654, filed Feb. 8, 2021, Pending.

\* cited by examiner

CURRENT MEASURING DEVICE FOR DETECTING A CURRENT IN AN ELECTRIC LINE

CROSS-REFERENCE TO PRIOR APPLICATIONS

This application is a U.S. National Phase Application under 35 U.S.C. § 371 of International Application No. PCT/EP2019/071244, filed on Aug. 7, 2019, and claims benefit to German Patent Application No. DE 10 2018 120 009.9, filed on Aug. 16, 2018. The International Application was published in German on Feb. 20, 2020 as WO 2020/035372 under PCT Article 21(2).

FIELD

The disclosure relates to a current measuring device for detecting a current in an electric line.

BACKGROUND

Such a current measuring device comprises a housing, a fastening device which is arranged on the housing and is intended to fasten the housing to a supporting rail, and at least one magnetic field sensor.

Such a current measuring device can be used, in particular, to monitor so-called string currents in solar installations. Solar panels are usually connected in series with one another, for example, via lines, with the result that currents—the so-called string currents—flow between the solar panels. It is desirable to detect the currents on such lines for the purpose of monitoring string currents.

However, such a current measuring device can also be used in the process industry or in the field of E-mobility to measure currents.

A current measuring device of the type in question here can be arranged on a supporting rail and can be combined with other electric or electronic devices in a flexible manner in order to provide an arrangement of electric and/or electronic devices on a supporting rail. Such a current measuring device may also be combined, for example, with other current measuring devices on a supporting rail in order to measure a current on a plurality of electric lines.

Current measuring devices which usually make it necessary to disconnect electric lines on which the currents are to be detected are known for the purpose of monitoring string currents. This is complicated and also constitutes considerable intervention in the system.

In a current measuring device known from DE 10 2014 119 276 A1, electric lines can be laid between housing halves in order to detect a magnetic field on the electric lines by means of magnetic field sensors and to infer a current flow in the electric lines therefrom. In order to place the current measuring device onto the electric lines to be monitored, it is necessary to separate the housing halves from one another. In the placed-on position, the electric lines extend through the housing of the current measuring device.

SUMMARY

In an embodiment, the present invention provides a current measuring device for detecting a current in an electric line, comprising: a housing; a fastening device arranged on the housing and configured to fasten the housing to a supporting rail; and at least one magnetic field sensor, wherein the housing has a first housing part and a second housing part which together form an accommodating device configured to accommodate an electric line between the first and second housing parts, wherein the first and second housing parts are separable from one another in order to place an electric line onto the current measuring device and placeable onto one another in order to accommodate the electric line in the accommodating device between the first and second housing parts, and wherein the at least one magnetic field sensor is configured to detect a magnetic field on the electric line accommodated in the accommodating device.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
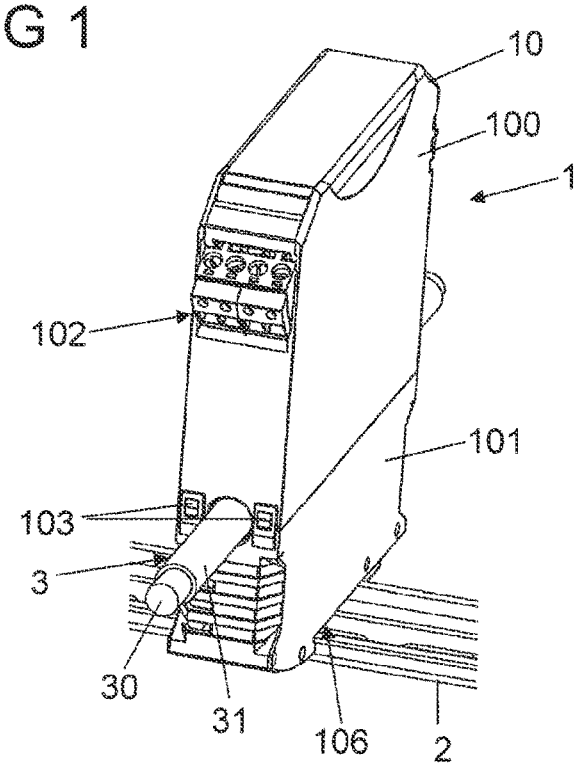
FIG. 1 shows a view of a current measuring device on a supporting rail.

In an embodiment, the present invention provides a current measuring device which makes it possible to detect a current on an electric line in a simple manner and can be arranged, together with other electric or electronic devices, on a supporting rail.

In an embodiment, the present invention provides a current measuring device having features as described herein.

Accordingly, the housing has a first housing part and a second housing part which together form an accommodating device for accommodating an electric line between the housing parts. The housing parts can be separated from one another in order to place an electric line onto the current measuring device and can be placed onto one another in order to accommodate the electric line in the accommodating device between the housing parts. The at least one magnetic field sensor is designed to detect a magnetic field on the electric line accommodated in the accommodating device.

For example, each housing part may have an accommodating slot, wherein the accommodating slots of the housing parts together form the accommodating device for accommodating the electric line. Each accommodating slot may have a semi-circular cross section, for example, thus resulting in an accommodating channel for the electric line having a circular cross section (at least in certain regions) when the housing parts are assembled.

The current measuring device may be fastened to a supporting rail via its fastening device. The housing of the current measuring device is formed in this case by two housing parts which can be separated from one another in order to lay an electric line between the housing parts. The electric line is accommodated between the housing parts by assembling the housing parts in such a manner that a current flowing through the electric line can be detected using one or more magnetic field sensors and can be (quantitatively and/or quantitatively) evaluated.

As a result of the fact that the current measuring device can be placed onto a supporting rail, the current measuring device can be combined in any desired manner with other electric and/or electronic devices, for example further current measuring devices. An electric installation which can be configured flexibly can therefore be provided on a supporting rail, for example in a switchgear cabinet.

In one configuration, the first housing part has one or more first magnetic field sensors and/or the second housing part has one or more second magnetic field sensors. In principle, a single magnetic field sensor suffices to detect a magnetic field on the electric line to be monitored. Such a magnetic field sensor may be arranged on the first housing part or the second housing part. However, the current measurement can be improved by using a plurality of magnetic field sensors on the first housing part and/or on the second housing part by virtue of interference field effects being able to be removed by means of external magnetic fields, which can improve the measurement accuracy.

For example, in one configuration, two or more magnetic field sensors, which are arranged in a manner uniformly distributed around the electric line to be monitored, may be arranged on each housing part if the housing parts are placed onto one another. When the housing parts are assembled, the magnetic field sensors are arranged in a close positional relationship with respect to the electric line to be monitored and are grouped around the electric line, with the result that a magnetic field produced on account of a current flow through the electric line can be jointly detected via the magnetic field sensors in order to draw conclusions on the current flow in the electric line on the basis of sensor signals generated by the magnetic field sensors.

If magnetic field sensors are arranged both on the first housing part and on the second housing part, the housing parts are preferably electrically connected to one another via a suitable plug connector device. When the housing parts are placed onto one another, an electric connection between the housing parts is established via the plug connector device, with the result that sensor signals from the magnetic field sensors can be passed to a control device arranged on one of the housing parts.

In one configuration, the first housing part has a first flux concentrator part and/or the second housing part has a second flux concentrator part for guiding a magnetic flux around the electric line accommodated in the accommodating device. Such a flux concentrator part may be in the form of a ferromagnetic armature, for example. In this case, each housing part may have a flux concentrator part in the form of a half-ring, which, when the housing parts are placed onto one another, form a closed flux concentrator ring in the form of a toroid for guiding the magnetic flux around the electric line accommodated in the accommodating device in an annular manner, wherein the at least one magnetic field sensor is arranged on the flux concentrator ring. For example, the at least one magnetic field sensor may be integrated in one of the flux concentrator parts.

The flux concentrator parts are used to concentrate the magnetic flux density on the electric conductor accommodated between the housing parts. The flux concentrator parts which preferably together form a toroid focus the field lines around the conductor and homogenize them, which also makes it possible to measure small currents in the electric conductor.

One or more magnetic field sensors may be connected to one another on the flux concentrator parts in a so-called open-loop configuration or a closed-loop configuration.

In one configuration, the at least one magnetic field sensor is formed by a magnetoresistive sensor. Such magnetoresistive sensors make use of the so-called magnetoresistive effect, as a result of which the electric resistance of a material changes on the basis of an external magnetic field. Such a resistance change can be detected and evaluated in order to infer the strength of the magnetic field on the basis of the resistance change and to infer therefrom the strength of the current flow in the electric conductor.

Such magnetoresistive sensors can be used to detect temporally variable alternating magnetic fields in the case of an electric alternating current as well as temporally invariable magnetic fields in the case of a direct current in the electric line, with the result that both AC detection and DC detection on the electric line to be monitored are possible.

The fastening device may be arranged on the second housing part, for example. The fastening device can be used to secure the second housing part and, and the latter can be used to secure the housing of the current measuring device, to the supporting rail in a form-fitting manner, for example, by latching the second housing part to the supporting rail. In the fastened position, the current measuring device is fixedly held on the supporting rail and can be combined with other electric or electronic devices, for example, on the supporting rail.

In one configuration, the current measuring device has an electronic assembly which is enclosed in the housing and has a control device for evaluating sensor signals received via the at least one magnetic field sensor. The electronic assembly may have, for example, a printed circuit board on which both the at least one magnetic field sensor and an electronic chip for implementing the control device are arranged. The at least one magnetic field sensor is connected to the control device and passes its sensor signals to the control device which evaluates the sensor signals in order to infer a current flow in the electric line placed onto the current measuring device on the basis of the sensor signals.

The electronic assembly may be arranged on the first housing part, for example. If the fastening device is arranged on the second housing part, the result is therefore a configuration of the housing in which the housing parts are functionally different. Electric and electronic functions, in particular control and evaluation functions, are undertaken in the current measuring device via the electronic assembly. The current measuring device can be mechanically fastened to a supporting rail via the fastening device on the second housing part.

In one configuration, the current measuring device has a calibration assembly having a test conductor to which a test current can be applied and which is arranged in the housing with respect to the at least one magnetic field sensor in such a manner that an evaluation of a detected magnetic field can be calibrated on the basis of a test current. For example, under the control of the control device, a test current can be generated, for example, by a controllable current source, with the result that a defined current is conducted through the test conductor. In this case, the test conductor is arranged in a defined positional relationship with respect to the at least one magnetic field sensor, with the result that a magnetic field is detected at one or more magnetic field sensors on the basis of the test current. On the basis of the known test current and the known positional relationship of the test conductor with respect to the at least one magnetic field sensor, a calibration can be carried out using the magnetic fields detected in this manner in order to determine the current flowing in an electric line from the sensor signals detected by means of the at least one magnetic field sensor.

In this case, a test conductor may be assigned to each magnetic field sensor in an arrangement of magnetic field sensors, with the result that the magnetic field sensors can be individually calibrated and tested for their functionality. However, it is also conceivable to assign a test conductor to only one magnetic field sensor in order to calibrate the current measuring device overall on the basis of the one test conductor.

The test conductor may be, for example, in the form of a separate, for example electrically insulated, conductor which is arranged in a defined positional relationship with respect to an assigned magnetic field sensor. However, it is also conceivable and possible to form a test conductor by means of a conductor track on a printed circuit board, for example.

In one configuration, the current measuring device has a connection device for connecting a line for providing an electric supply and/or for transmitting data signals. For example, the current measuring device can be electrically fed via the connection device in order to electrically supply the electronic assembly enclosed in the housing. In this case, data signals—for example measured values which indicate currents flowing through the electric lines—or analog standard signals in a range of 0/4 to 20 mA or −20 mA to +20 mA, for example, or voltage signals in a range of 0 to 10 V, 0 to 5 V, −10 V to +10 V etc., for example, can also be transmitted to a superordinate assembly via the connection device in this case.

If the connection device is in the form of a data connection, the connection device may be in the form of a USB interface, an RS-485 connection, an Ethernet connection or another serial interface, for example. In one advantageous configuration, it is conceivable and possible for both an electric supply and a data transmission to be carried out via the connection device.

The connection device is arranged, for example, on the first housing part on which the electronic assembly is also arranged. One or more electric feed lines can therefore be connected to the electronic assembly via the connection device.

FIG. 1 shows one exemplary embodiment of a current measuring device 1 which has a housing 10 composed of two housing parts 100, 101 and can be arranged on a supporting rail 2, possibly in combination with other electric or electronic devices. The current measuring device 1 is used to measure a current flow through an electric line 3 accommodated between the housing parts 100, 101.

Figure 2:
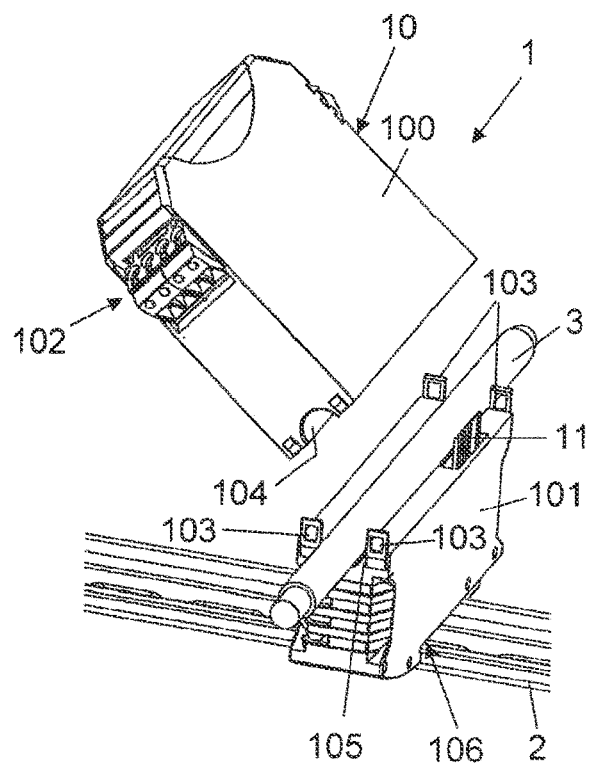
FIG. 2 shows a view of one exemplary embodiment of a current measuring device with housing parts which have been separated from one another.
Figure 3:
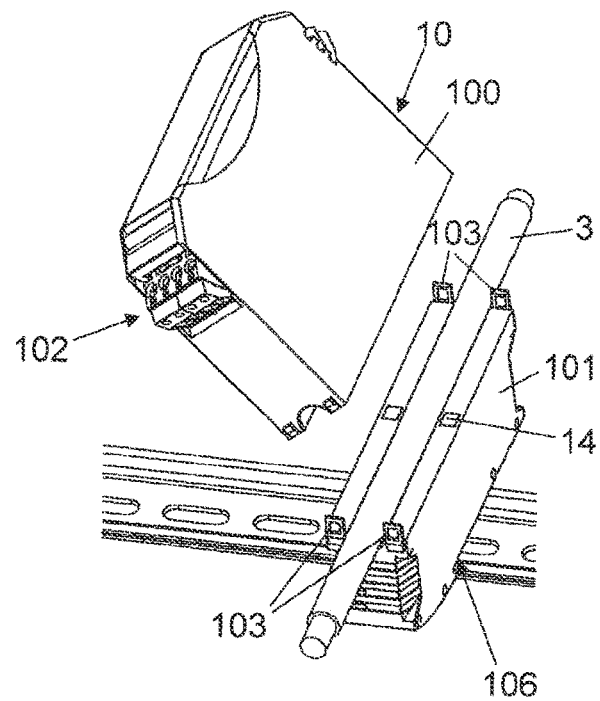
FIG. 3 shows a view of another exemplary embodiment of a current measuring device with housing parts which have been separated from one another.

As is apparent from FIGS. 2 and 3, the housing parts 100, 101 of the housing 10 of the current measuring device 1 each have an accommodating slot 104, 105 which together form an accommodating device for accommodating the electric line 3 between the housing parts 100, 101. The housing parts 100, 101 can be joined in order to enclose and secure the electric line 3 between the housing parts 100, 101 in a position placed onto one another and to monitor a current flow through the electric line 3.

In a position placed onto one another, the housing parts 100, 101 are releasably connected to one another via a latching connection 103. The housing parts 100, 101 can be separated from one another in order to remove the electric line 3 from the current measuring device 1 again and possibly to place another electric line 3 between the housing parts 100, 101.

At least one of the housing parts 100, 101 has a magnetic field sensor 15, 15A, 15B (see FIGS. 4 and 5) which is used to detect a magnetic field on an electric line 3 accommodated between the housing parts 100, 101 and to pass generated sensor signals to a control device 16 (see FIG. 7) in order to draw conclusions on the current flowing through the electric line 3 on the basis of the sensor signals.

Different configurations of the current measuring device 1 are conceivable and possible.

Figure 5:
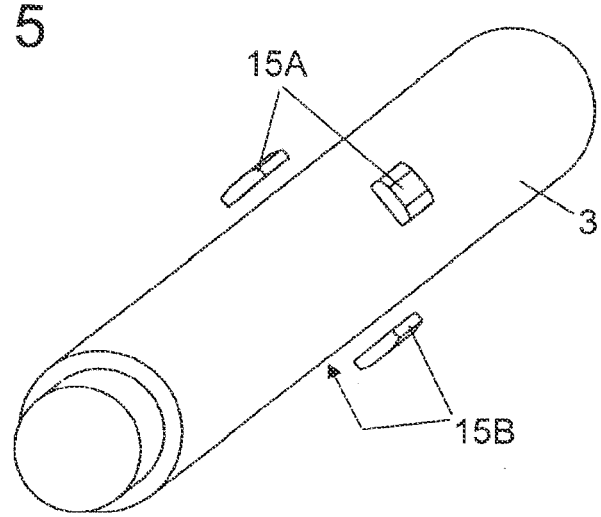
FIG. 5 shows a view of one exemplary embodiment of magnetic field sensors grouped around an electric line.

For example, magnetic field sensors 15A, 15B can be arranged on each housing part 100, 101, as is implemented in the exemplary embodiment according to FIG. 5. In this case, magnetic field sensors 15A are arranged on the first housing part 100, whereas magnetic field sensors 15B are fitted to the second housing part 101. When the housing parts 100, 101 are placed onto one another, the magnetic field sensors 15A, 15B are grouped with one another and are arranged in a manner uniformly distributed around the electric line 3 to be monitored in such a manner that the magnetic field on the electric line 3 can be detected by means of the magnetic field sensors 15A, 15B in order to draw conclusions on the current in the electric line 3 on the basis of sensor signals generated by the magnetic field sensors 15A, 15B.

If magnetic field sensors 15A, 15B are arranged on each housing part 100, 101, the housing parts 100, 101 are preferably electrically connected to one another, in a position placed onto one another, via an electric plug connector device 11, as illustrated in FIG. 2, with the result that sensor signals from the magnetic field sensors 15B of the second housing part 101, for example, can be passed to the control device 16 on the first housing part 100 via the plug connector device 11.

Figure 4:
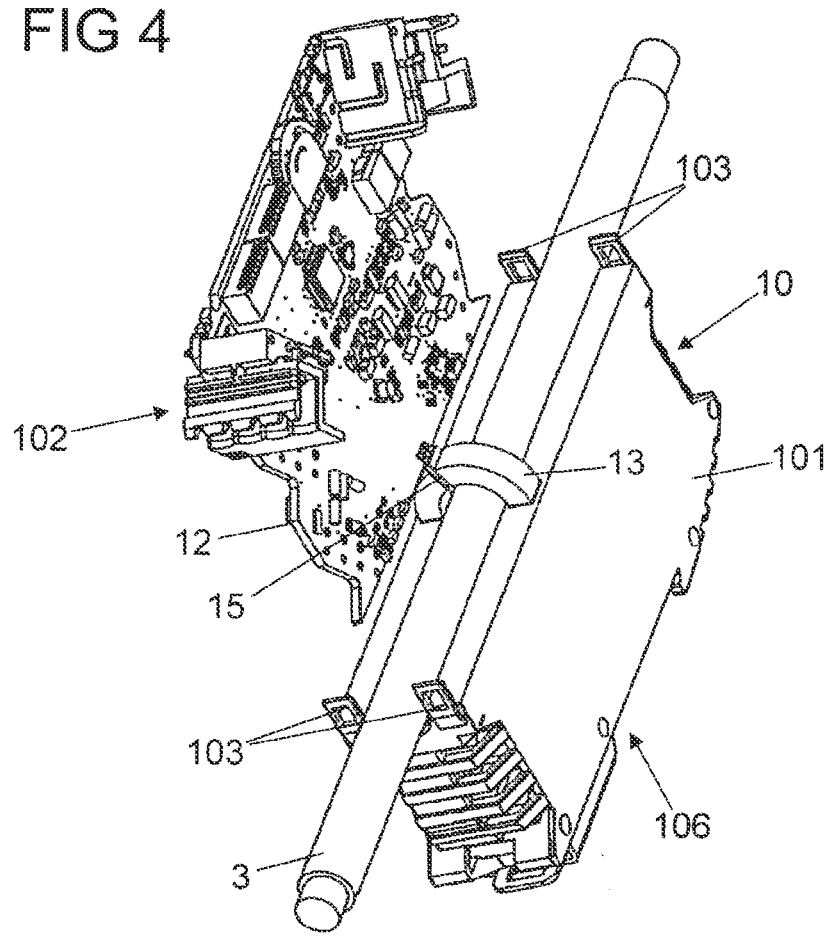
FIG. 4 shows a view of the current measuring device according to FIG. 3 illustrating an electronic assembly for evaluating sensor signals received via a magnetic field sensor.

In another configuration, a magnetic field sensor 15 is arranged only on the first housing part 100, as illustrated in FIG. 4, wherein, in this exemplary embodiment, the first housing part 100 and the second housing part 101 each have a flux concentrator part 13, 14 in the form of a half-ring, which, when the housing parts 100, 101 are placed onto one another, are joined to form a circumferential flux concentrator ring in the form of a toroid.

Such a flux concentrator ring is used to concentrate the magnetic flux around the electric line 3. As is apparent from FIG. 4, the flux concentrator ring formed by the flux concentrator parts 13, 14 is interrupted here by a magnetic field sensor 15 on the first housing part 100, with the result that the magnetic flux conducted by the flux concentrator ring can be detected by the magnetic field sensor 15.

In the exemplary embodiment according to FIGS. 3 and 4, the second housing part 101 is passive with regard to the current measurement. A plug connector device 11 for electrically connecting the housing parts 100, 101 to one another is not required in this case.

The magnetic field sensors 15, 15A, 15B may be formed by magnetoresistive sensors, for example. Magnetic field sensors 15, 15A, 15B in the form of magnetoresistive sensors have an electric resistance which is variable depending on the magnetic field generated by the electric line 3. The magnetic field sensors 15, 15A, 15B are connected to an electronic assembly 12, in particular a printed circuit board, via connection lines in such a manner that sensor signals which depend on the magnetic field existing on the electric line 3 can be received via the magnetic field sensors 15, 15A, 15B and can be evaluated in order to draw conclusions on a current flowing through the electric line 3 on the basis of the sensor signals.

The electric line 3 has a line wire 30 which is surrounded by an electrically insulating sheath 31 and through which a current flows during operation of the superordinate electric installation to which the line 3 is connected. The current flow results in a magnetic field on the electric line 3, which magnetic field circularly surrounds the electric line 3 and also penetrates the magnetic field sensors 15, 15A, 15B and influences the electric resistance at the magnetic field sensors 15, 15A, 15B on account of the magnetoresistive effect. The field strength of the magnetic field around the electric line 3 can therefore be inferred on the basis of a voltage drop across the magnetic field sensors 15, 15A, 15B, for example, in order to draw conclusions on the current flow through the electric line 3 therefrom.

Figure 7:
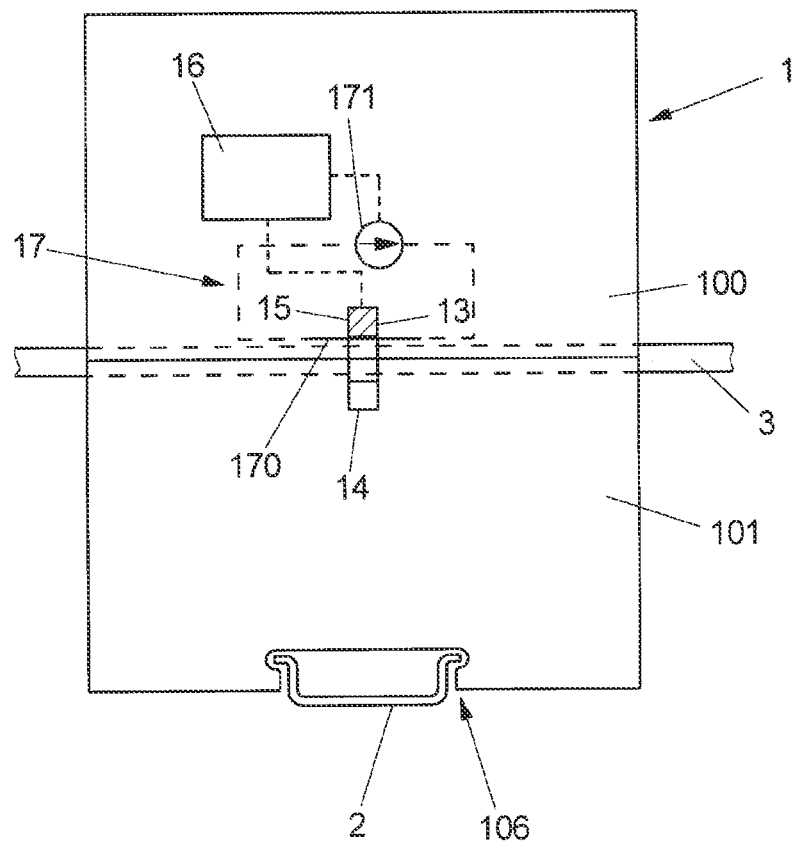
FIG. 7 shows a schematic view of a basic circuit diagram of one exemplary embodiment of a current measuring device.

As is apparent from the basic circuit diagram according to FIG. 7, the current measuring device 1 has, in one exemplary embodiment, a control device 16, for example in the form of a processor arranged on a printed circuit board, to which the magnetic field sensors 15, 15A, 15B assigned to the different accommodating slots 100 are connected. The control device 16 is used to evaluate sensor signals received via the magnetic field sensors 15, 15A, 15B in order to draw conclusions on a current on an electric line 3 to be monitored.

Determination of the current intensity in an electric line 3 on the basis of received sensor signals can be carried out on the basis of a calibration, for example. For the purpose of the calibration, the current measuring device 1 may have, for example, a calibration assembly 17, as in the exemplary embodiment according to FIG. 7, which calibration assembly makes it possible to carry out a self-calibration of the current measuring device 1. Such a self-calibration can be carried out before activation as well as during ongoing operation in order to calibrate the current measuring device 1 before activation and during operation.

The calibration assembly 17 has a test conductor 170 which is arranged in a defined positional relationship with respect to an assigned magnetic field sensor 15 and extends through the flux concentrator parts 13, 14, for example, with the result that a calibration can be carried out on the basis of a current flow through the test conductor 170, which calibration allows a conclusion with regard to the current intensity in an electric line 3 on the current measuring device 1.

The test conductor 170 is connected to a current source 171 which can be controlled via the control device 16 and can be used to conduct a defined current through the test conductor 170. On the basis of the defined current and the sensor signals received via the magnetic field sensor 15, a calibration can be carried out with the inclusion of the positional relationship of the test conductor 170 with respect to the assigned magnetic field sensor 15 and the flux concentrator parts 13, 14, which calibration relates current values to detected sensor signals dependent on the magnetic field, with the result that it is possible to create, for example, a calibration table, on the basis of which the current intensity of a current flowing in an electric line 3 can be determined during actual operation on the basis of the sensor signals detected by means of the at least one magnetic field sensor 15, 15A, 15B.

Figure 8:
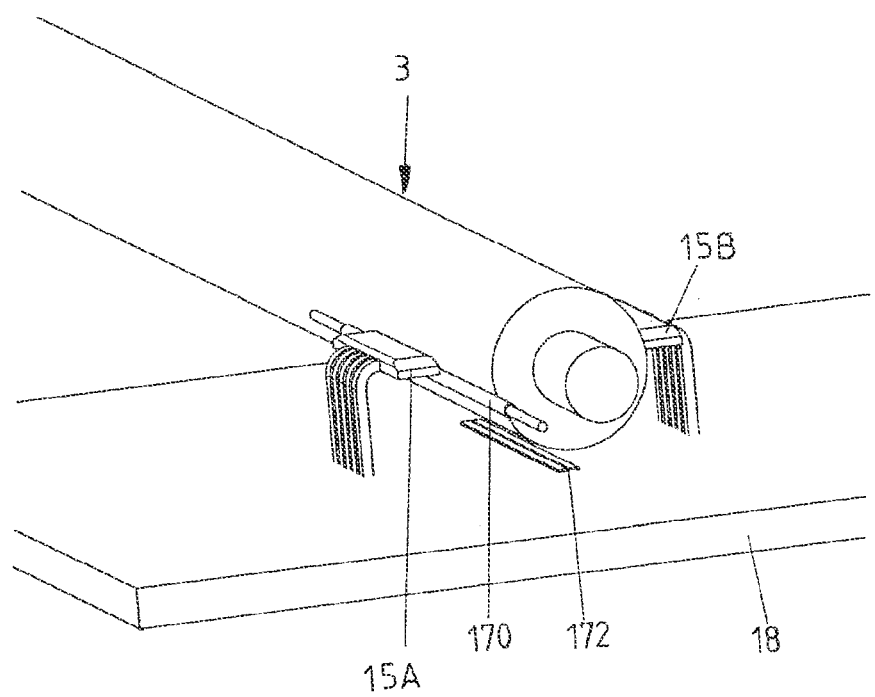
FIG. 8 shows a view of an arrangement of a test conductor of a calibration assembly relative to a magnetic field sensor.

As is apparent in the exemplary embodiment according to FIG. 8, the test conductor 170 may be in the form of an insulated electric line having a line wire which is enclosed in a cable sheath and extends along the longitudinal direction of extent, along which a line 3 is accommodated on the housing 10, and is arranged in a defined positional relationship with respect to an assigned magnetic field sensor 15A, 15B.

Additionally or alternatively, a test conductor 172 may also be formed by a conductor track on a printed circuit board 18, on which other electric and electronic components of the current measuring device 1 are also arranged (in particular the magnetic field sensors 15, 15B and the control device 16).

The test conductor 170, 172 is respectively connected to a current source 171 for introducing a test current.

The current measuring device 1 has a connection device 102 on the first housing part 100, via which a feed line can be connected to the current measuring device 1 in order to provide an electric supply at the current measuring device 1 and/or to transmit data to the current measuring device 1 or from the current measuring device 1 to a superordinate assembly.

If the connection device 102 is designed to transmit data, the connection device 102 may be implemented by a USB interface, an RS-485 interface or an Ethernet interface, for example.

In one advantageous configuration, the connection device 102 is designed to provide an electric supply at the current measuring device 1 and also to transmit data.

In the exemplary embodiments illustrated, an electronic assembly 12, the constituent part of which is the control device 16 and to which the connection device 102 is also connected, is enclosed in the first housing part 100, as apparent from FIG. 4. The electronic assembly 12 has, in particular, a printed circuit board on which electric and electronic components are arranged. The control device 16 may be implemented by means of an electronic chip on the printed circuit board, for example.

Figure 6:
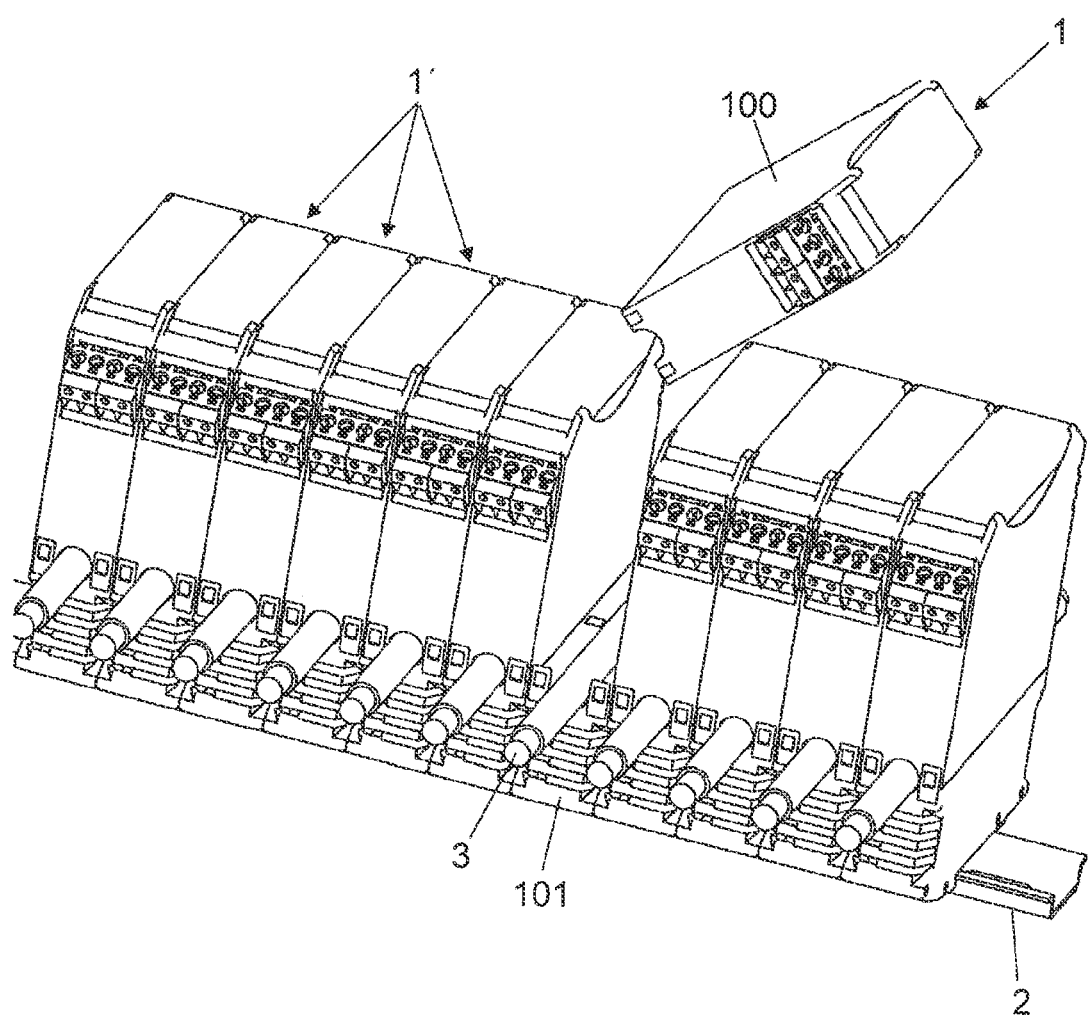
FIG. 6 shows a view of an arrangement of current measuring devices on a supporting rail.

A fastening device 106 for fastening the current measuring device 1 to a supporting rail 2 in a latching manner is arranged in the second housing part 101 on a side facing away from the first housing part 100. As illustrated in FIG. 6, the current measuring device 1 can be combined with other electric or electronic devices, for example other current measuring devices 1', on the supporting rail 2 in order to provide an electric installation on a supporting rail 2, for example in a switchgear cabinet.

The concept on which the solution is based is not restricted to the exemplary embodiments described above, but rather can also be implemented in an entirely different manner.

A current measuring device of the described type is not only suitable, in particular, for monitoring string currents in solar installations, but rather may be used, in principle, to measure current in entirely different electric installations, for example in process technology or in the field of E-mobility.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS 1, 1' Current measuring device
10 Housing
100, 101 Housing part
102 Connection device
103 Latching connection
104, 105 Accommodating device (accommodating slot)
106 Fastening device
11 Plug connector device
12 Electronic assembly (printed circuit board)
13, 14 Flux concentrator part
15, 15A, 15B Magnetic field sensor
16 Control device
17 Calibration assembly
170 Test conductor
171 Current source
172 Test conductor
18 Printed circuit board
2 Supporting rail
20 Connection
3 Lines

The invention claimed is:

1. A current measuring device for detecting a current in an electric line, comprising:
a housing;
a fastening device arranged on the housing and configured to fasten the housing to a supporting rail; and
at least one magnetic field sensor,
wherein the housing has a first housing part and a second housing part which together form an accommodating device configured to accommodate an electric line between the first and second housing parts,
wherein the first and second housing parts are separable from one another in order to place an electric line onto the current measuring device and placeable onto one another in order to accommodate the electric line in the accommodating device between the first and second housing parts,
wherein the at least one magnetic field sensor is configured to detect a magnetic field on the electric line accommodated in the accommodating device, and
wherein at least one of the first housing part has a first flux concentrator part or the second housing part has a second flux concentrator part configured to guide a magnetic flux on the electric line accommodated in the accommodating device.

2. The current measuring device of claim 1, wherein at least one of: the first housing part has at least one first magnetic field sensor or the second housing part has at least one second magnetic field sensor.

3. The current measuring device of claim 1, further comprising:
an electric plug connector device configured to electrically connect the first and second housing parts to one another.

4. The current measuring device of claim 1, wherein the first flux concentrator part of the first housing part and the second flux concentrator part of the second housing part are joined to form a flux concentrator ring when the first and second housing parts have been placed onto one another, and
wherein the at least one magnetic field sensor is arranged on the flux concentrator ring.

5. The current measuring device of claim 1, wherein the at least one magnetic field sensor comprises a magnetoresistive sensor.

6. The current measuring device of claim 1, wherein the fastening device is arranged on the second housing part.

7. The current measuring device of claim 1, further comprising:
an electronic assembly enclosed in the housing, the electronic assembly comprising a control device configured to evaluate sensor signals received via the at least one magnetic field sensor.

8. The current measuring device of claim 7, wherein the electronic assembly is arranged on the first housing part.

9. The current measuring device of claim 1, further comprising:
a calibration assembly having a test conductor to which a test current is applicable and which is arranged in the housing with respect to the at least one magnetic field sensor such that an evaluation of a detected magnetic field is calibratable based on a test current.

10. The current measuring device of claim 1, further comprising:
a connection device configured to at least one of connect a line for providing an electric supply or transmit data signals.

11. The current measuring device of claim 10, wherein the connection device is arranged on the first housing part.

12. A current measuring device for detecting a current in an electric line, comprising:
a housing;
a fastening device arranged on the housing and configured to fasten the housing to a supporting rail;
at least one magnetic field sensor; and
a calibration assembly having a test conductor to which a test current is applicable and which is arranged in the housing with respect to the at least one magnetic field sensor such that an evaluation of a detected magnetic field is calibratable based on a test current,
wherein the housing has a first housing part and a second housing part which together form an accommodating device configured to accommodate an electric line between the first and second housing parts,
wherein the first and second housing parts are separable from one another in order to place an electric line onto the current measuring device and placeable onto one another in order to accommodate the electric line in the accommodating device between the first and second housing parts, and wherein the at least one magnetic field sensor is configured to detect a magnetic field on the electric line accommodated in the accommodating device.

\* \* \* \* \*